United States Patent [19]
Lesk

[11] Patent Number: 4,481,378
[45] Date of Patent: Nov. 6, 1984

[54] PROTECTED PHOTOVOLTAIC MODULE

[75] Inventor: Israel A. Lesk, Phoenix, Ariz.

[73] Assignee: Motorola, Inc., Schaumburg, Ill.

[21] Appl. No.: 403,846

[22] Filed: Jul. 30, 1982

[51] Int. Cl.³ .............................................. H01L 31/04
[52] U.S. Cl. ....................................... 136/244; 357/30
[58] Field of Search ............................ 136/244; 357/30

[56] References Cited

U.S. PATENT DOCUMENTS

| | | | |
|---|---|---|---|
| 3,527,619 | 9/1970 | Miley | 136/244 |
| 3,887,935 | 6/1975 | Fischer et al. | 136/244 |
| 3,912,539 | 10/1975 | Magee | 136/244 |
| 4,348,545 | 9/1982 | Arnould | 136/244 |

FOREIGN PATENT DOCUMENTS 3005560 8/1981 Fed. Rep. of Germany ...... 136/244

*Primary Examiner*—Aaron Weisstuch
*Attorney, Agent, or Firm*—John A. Fisher

[57] ABSTRACT

A practical photovoltaic module is disclosed which is protected from reverse bias damage and which displays minimal power loss resulting from temporary inoperativeness of one or more individual photovoltaic cells included in the module. The module includes a plurality of series connected photovoltaic cells. Protection from inoperativeness of one or more of these cells is provided with only minimal power loss by providing a reversely poled diode across each of the series connected cells.

3 Claims, 15 Drawing Figures

PROTECTED PHOTOVOLTAIC MODULE

BACKGROUND OF THE INVENTION

This invention relates in general to a photovoltaic module and more specifically to a practical photovoltaic module which is protected from reverse bias damage caused by inoperativeness of one or more cells making up the module.

Photovoltaic modules are used for the generation of electrical energy upon exposure to illumination. The photovoltaic module comprises a plurality of individual cells connected together in a series string or in a combination series-parallel string. The particular combination of series or series-parallel and the number of cells included in the module depends upon the particular current-voltage requirements of the module.

Under nominal conditions, when a photovoltaic module is illuminated, each of the individual photovoltaic cells making up the module is forward biased. If one of the series connected photovoltaic cells is at least temporarily inoperative, however, it becomes susceptible to possibly serious permanent thermal damage if its available short circuit current becomes less than the current carried by the series string. Should this occur the cell may be forced into reverse bias under a voltage shock that can result in excessive localized power dissipation. Conditions leading to this potentially destructive situation can occur, for example, by a temporary shadowing of one or more of the cells in the string, or even of part of a cell.

Current design practice for protecting against such potential damage is to place a protective diode, poled to be reversed biased, across a string of 10-15 cells or across an entire module of 30-36 series connected cells. This protective diode arrangement, however, is often not sufficiently effective to prevent substantial module damage. In addition, even in those instances in which the protective diode provides adequate protection, the protective diode results in the waste of substantial amounts of module array power.

It is therefore an object of this invention to provide a photovoltaic module having improved protection against the inoperativeness of one or more cells making up the module.

It is a further object of this invention to provide an improved method of protecting solar energy modules.

It is yet another object of this invention to provide an improved photovoltaic module having improved protection against damage and without wasting substantial amounts of power.

SUMMARY OF THE INVENTION

The foregoing as well as other objects and advantages are achieved in the present invention through the use of a protective diode placed across each photovoltaic cell making up the module. The protection diodes are in parallel with and poled oppositely to the photovoltaic cells.

DETAILED DESCRIPTION OF PREFERRED EMBODIMENTS

A photovoltaic cell for the conversion of solar energy to electrical energy comprises a large area PN junction diode. A silicon solar cell, for example, is one such photovoltaic cell.

Figure 1:
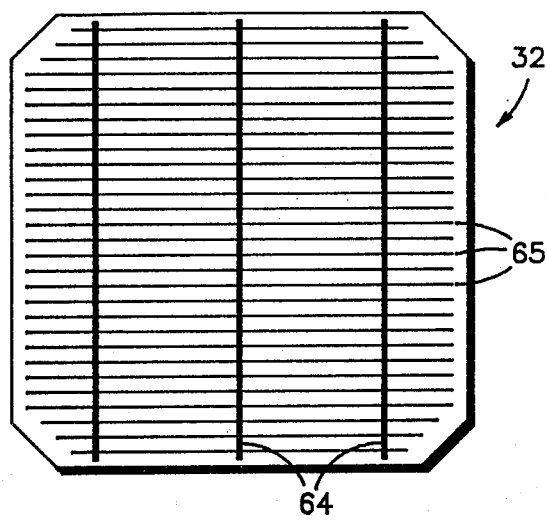
FIG. 1 illustrates typical metallization on the surface of a single photovoltaic cell.

FIG. 1 illustrates typical metallization on the top surface of a photovoltaic cell 32. The metallization includes a plurality of bus lines 64 interconnected with a plurality of fine grid lines 65. The metallization makes electrical contact to one side of the PN junction. The other side of the junction is contacted on the reverse side of the cell, usually by a uniform, unpatterned metal layer. The combination of bus lines and grid lines cooperates to provide an optimum low resistance path for any photovoltaically generated current while minimizing the amount of surface area of the cell masked from the impinging illumination.

Figure 2:
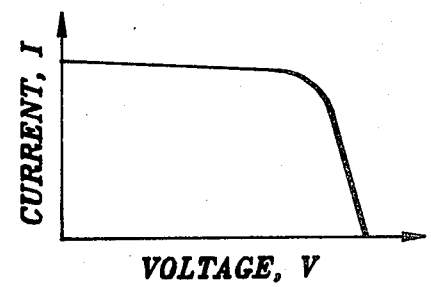
FIG. 2 illustrates the current/voltage (I/V) characteristics of a single illuminated photovoltaic cell.

Upon illumination, the PN junction diode is forward biased, providing a current/voltage characteristic as illustrated in FIG. 2. In practical usage a plurality of individual cells are connected together in a series string or a series-parallel network to provide the requisite current and voltage required for a particular application.

Figure 3:
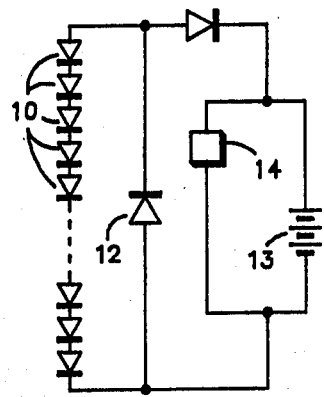
FIG. 3 illustrates a series string of photovoltaic cells protected in prior art manner.

FIG. 3 illustrates a string of N series connected photovoltaic cells 10 protected in prior art manner by a single shunt protective diode 12. The string is shown in an application in which a battery 13 is being charged. A voltage regulator 14, in parallel with the battery, limits the voltage applied to the battery. When N' of these cells are shadowed they may be subjected to an appreciable reverse bias as the system seeks to maintain the same current through the series element. The average value of the reverse voltage across one of the N' cells is given by $$V_R = (1/N')[(N-N')V_{N'} + V_D]$$

where $V_{N'}$ is the resulting average forward voltage drop across one of the $N-N'$ normally illuminated cells and $V_D$ is the forward voltage drop across the protective diode. When only a few cells of a large string are shadowed such that $$N' << N >> V_D/V_{N'},$$

$$V_R \doteq (N/N')V_{N'} >> V_{N'}$$

and the reverse voltage drop across the shadowed cell in a shunt diode protected string is much greater than the forward voltage generated across a normally illuminated cell.

A localized reverse current driven by the potential $V_R$ can destructively damage the photovoltaic cell. Recall that the photovoltaic cell is a large area PN junction diode. Because of a possibly random distribution of defects over the area of that large junction a high probability exists that a major portion of the reverse current will be concentrated in a single small area dominated by a defect and having a breakdown voltage lower than that characteristic of the remainder of the junction. This can result in an extremely high current density in that localized small area which can result in permanent, thermally induced damage to the cell. In addition, in large systems designed for high voltage operation, the reverse voltage can be high enough to cause arcing across cells that have become inoperative.

In addition to providing less than optimum protection, a shunt diode across a number of photovoltaic cells is wasteful of power generated. Under conditions of partial shadowing the current $I_S$ normally carried by the series string of photovoltaic cells is essentially maintained by the remainder of the array. The loss of power that results from the shunting action of the forward biased protective diode is given by $$P_L = I_S(NV_N + V_D)$$

where $V_N$ is the average forward voltage drop across a cell under uniform illumination of the series string. This loss is in excess of the loss of generated power associated with the N' shadowed cells plus the dissipation in the protective diode by the amount $$P_{LX} = I_S V_N (N - N') + V_D (I_S - I_D)$$
$$\doteq I_S V_N (N - N') \text{ for } I_S = I_D$$

where $I_D$ is the current carried by the protective diode. The power generated by the unshadowed cells of the string is lost in protecting the shadowed cells. For a large string such that $N - N' >> V_D/V_N$, the action of the protective diode across the string causes a loss of power that is greater than the loss caused by the shadowing of N' cells by a factor N/N'.

The above-described excessive degradation in output power over the life of a photovoltaic array is costly. The cost of such degradation is exacerbated by the fact that photovoltaic cells are normally operated above the knee in their I/V characteristics and are therefore required to carry a current that is within about 10% of their short circuit current. Any non-uniform reduction in illumination that is greater than about 10% of the nominal value will consequently drive the affected cells into reverse bias. The total cost of the excess loss in output depends, of course, upon the frequency of occurrence of such illumination non-uniformities.

Figure 4:
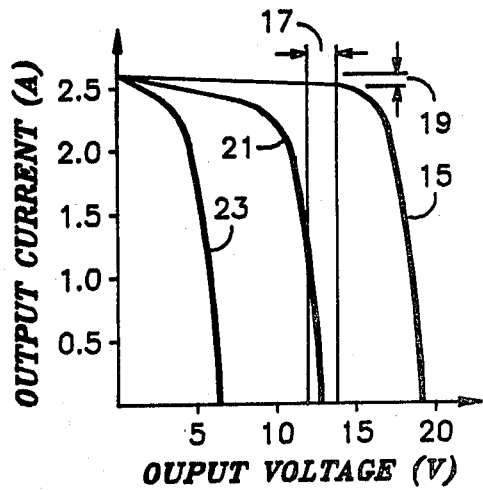
FIG. 4 illustrates I/V characteristics of a prior art protected module under uniform and non-uniform illumination.

The above described reduction in performance is illustrated in FIG. 4 which shows representative I/V characteristics observed for a 33 cell series connected module that utilizes three protective diodes, each connected across a string of eleven cells. The module is designed to operate at a nominal voltage of 13 volts. The I/V characteristic observed under uniform illumination is illustrated by a curve 15. The normal operating voltage range is indicated at 17. Corresponding to this voltage range is a normal current range indicated at 19.

Curve 21 illustrates the module characteristics corresponding to the situation in which one cell is shadowed into reverse bias. Curve 23 corresponds to the situation in which two adjacent cells in different strings are similarly shadowed. Curve 21 shows that the shadowing of one cell into reverse bias is sufficient to reduce the current output of the module, within its operating voltage range, by at least one-half. As indicated by curve 23, a similar shadowing of two cells renders the module completely inoperative within the designed operating range. A substantial reduction in performance thus accompanies even a temporary partial shadowing of the module. Consideration of curve 15 which shows the condition under uniform full illumination indicates that a reduction in the illumination of less than about 15% is sufficient to cause the value of the photogenerated current of any one cell to fall below the current required over the operating range, thereby driving the shadowed cell into reverse bias. Cells having a higher value of fill factor have an even greater sensitivity to partial shadowing.

Figure 5:
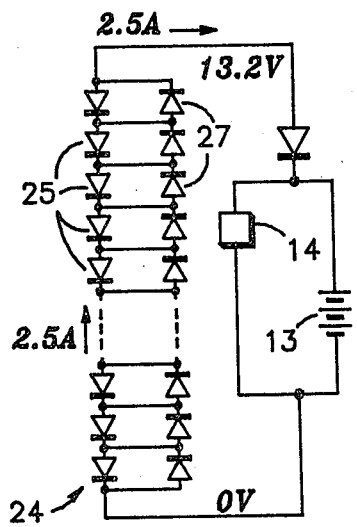
FIG. 5 illustrates a photovoltaic module protected in accordance with the invention.

The above related difficulty is overcome, in accordance with the invention, by removing from service only those cells of a series connected string whose photogeneration rate is reduced below a critical level, for example by shadowing, and by maintaining all other cells within their operating range. This is accomplished, in accordance with the invention, by providing an individual protective diode across each cell in the module. For example, a series string 24 of photovoltaic cells 25 having individual protective diodes 27 is illustrated in FIG. 5. Each protective diode 27 is a PN or Schottky barrier diode in parallel with and poled oppositely to each of the associated photovoltaic cells 25. The power loss and dissipation of each cell that is removed from service, for example by shadowing, is then limited to the normal output of that cell plus the dissipation of the protective diode, $$P_L = I_S(N'V_N + V_D); P_{LX} = 0.$$

Figure 6:
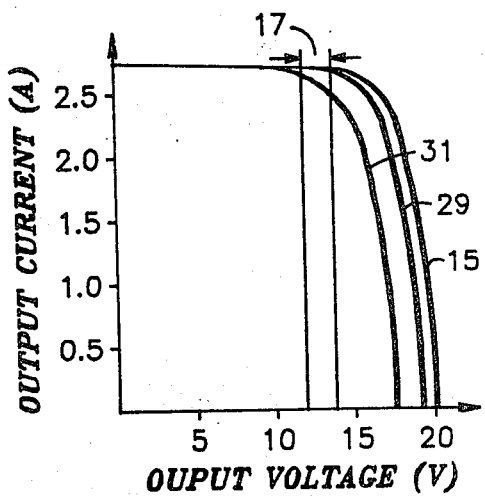
FIG. 6 illustrates I/V characteristics of a module protected in accordance with the invention.

The performance of a 33 cell series connected module with a protective diode across each cell is illustrated in FIG. 6. In this example each photovoltaic cell of the module is shunted by a protective Schottky barrier diode. Curve 15 again illustrates the I/V characteristics of the module under uniform illumination. Curve 29 illustrates the effect on the module output caused by shadowing one cell of the module into reverse bias. The output over the operating range is reduced by approximately 3%. Curve 31 illustrates the effect on the module output of shadowing two adjacent cells; because of the individual protective diodes, the module is maintained in operation with a reduction in output current of less than about 15%. The utilization of individual protective diodes results in a greater average output under a variety of either transient or permanent non-uniform shadowing conditions compared to protection by a single diode across an entire series string.

In implementing the protection of individual cells of a photovoltaic module in accordance with the invention, consideration must be given to the manner in which the diode shunting is accomplished in order that the protection not have an unfavorable impact upon the cost of the resulting system. The cost of the shunting diodes and the additional required interconnections is substantially reduced by utilizing an assembly process compatible with high volume photovoltaic module production techniques.

Figure 7:
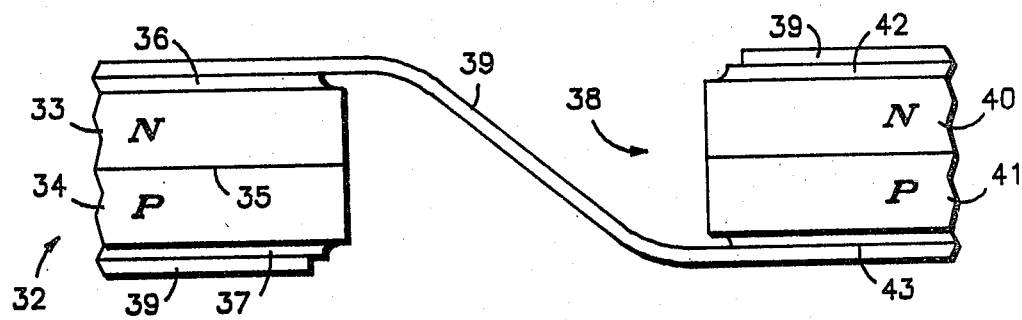
FIG. 7 illustrates interconnection of photovoltaic cells in a module.

FIG. 7 illustrates the type of busing normally used for the serial interconnecting of photovoltaic cells. A first cell 32 comprising an N region 33 and a P region 34 with a PN junction 35 therebetween and having metallization 36, 37 contacting the N and P regions, respectively, is serially connected to a second photovoltaic cell 38 by an interconnecting bus 39. Photovoltaic cell 38 comprises N region 40 and P region 41 with metallized layers 42 and 43 making contact to the N and P regions, respectively. Metal bus 39 is typically a metal ribbon soldered to the metallized regions 36 and 43 thereby joining the two cells in series.

Figure 8:
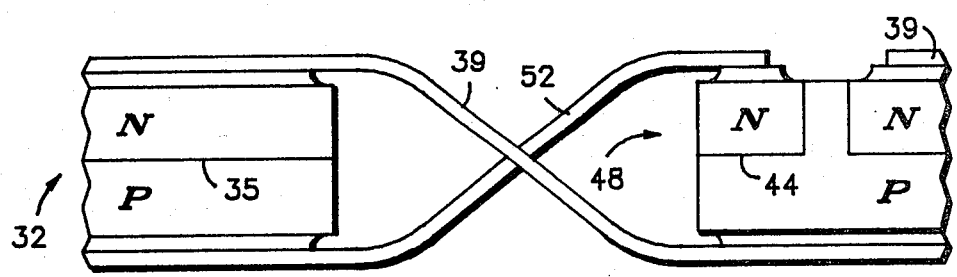
FIGS. 8-12 illustrate various embodiments of further interconnections for connecting protection diodes in parallel with each photovoltaic cell.
Figure 9:
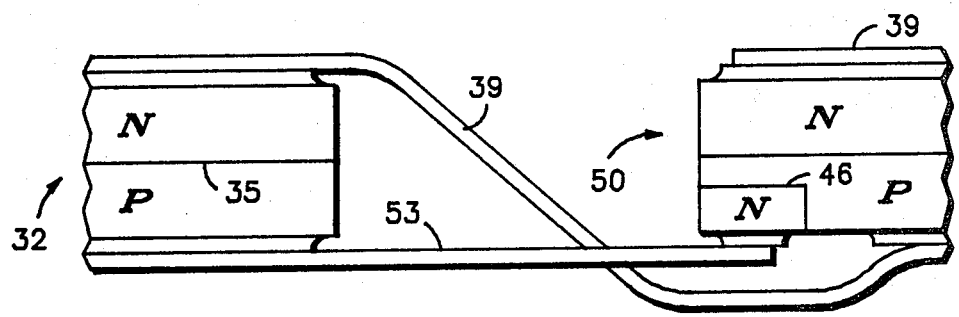

In addition to the serial connection shown in FIG. 7, additional interconnection is required to incorporate a shunt protective diode in accordance with the invention. FIGS. 8 and 9 illustrate the additional interconnection required to incorporate a protective diode fabricated integrally on the top or bottom surfaces of the photovoltaic cell, respectively. In FIG. 8 the PN junction 44, integral with photovoltaic cell 48 shunts junction 35 of photovoltaic cell 32. The shunt connection is provided by interconnection 52. Photovoltaic cells 32 and 48 are serially connected by interconnection bus 39.

In FIG. 9 protective PN junction 46 integral with the bottom surface of photovoltaic cell 50 shunts junction 35 of photovoltaic cell 32. Again, interconnect busing 39 series connects photovoltaic cells 32 and 50. Interconnect 53 provides the shunt connection.

The extra interconnect 52, 53 in FIGS. 8 and 9, respectively, is necessary to properly connect the protective shunt diodes. In order to minimize lost photovoltaic cell area or to minimize deleterious effects on cell efficiency, the integral protection diode must be of relatively small area. The small area has the disadvantage that an accurate placement of the interconnection 52, 53 is required to avoid shorting between cell and diode metallization.

Figure 10:
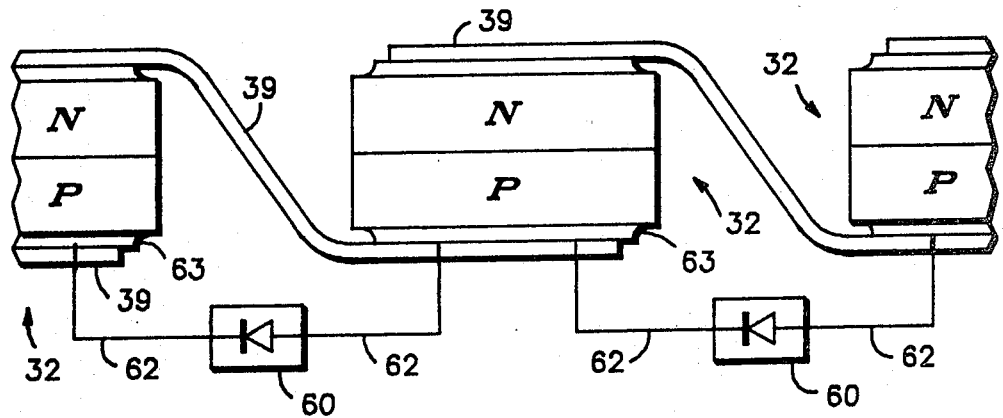

In a further embodiment of the invention, discrete protection diodes are used as an alternative to the integrally formed protection diodes. Discrete protection diodes can be placed in parallel with each of the cell junctions by attaching the diode between the bottom sides of adjacent cells. This can be done with greatly reduced requirements on the accuracy of placement of leads because the entire back surface of this cell is metallized and connection of the protection diode lead can be made anywhere on this metallized surface. The use of discrete protection diodes is illustrated in FIG. 10. A plurality of photovoltaic cells 32 are connected in series by interconnects 39. In accordance with the invention, discrete protective diodes 60 are placed in parallel with and poled oppositely to each of the photovoltaic cells Diode leads 62 are attached by soldering or other means to the bottom metallization 63 which is essentially coextensive with the total area of the bottom surface of the cell.

Figure 11:
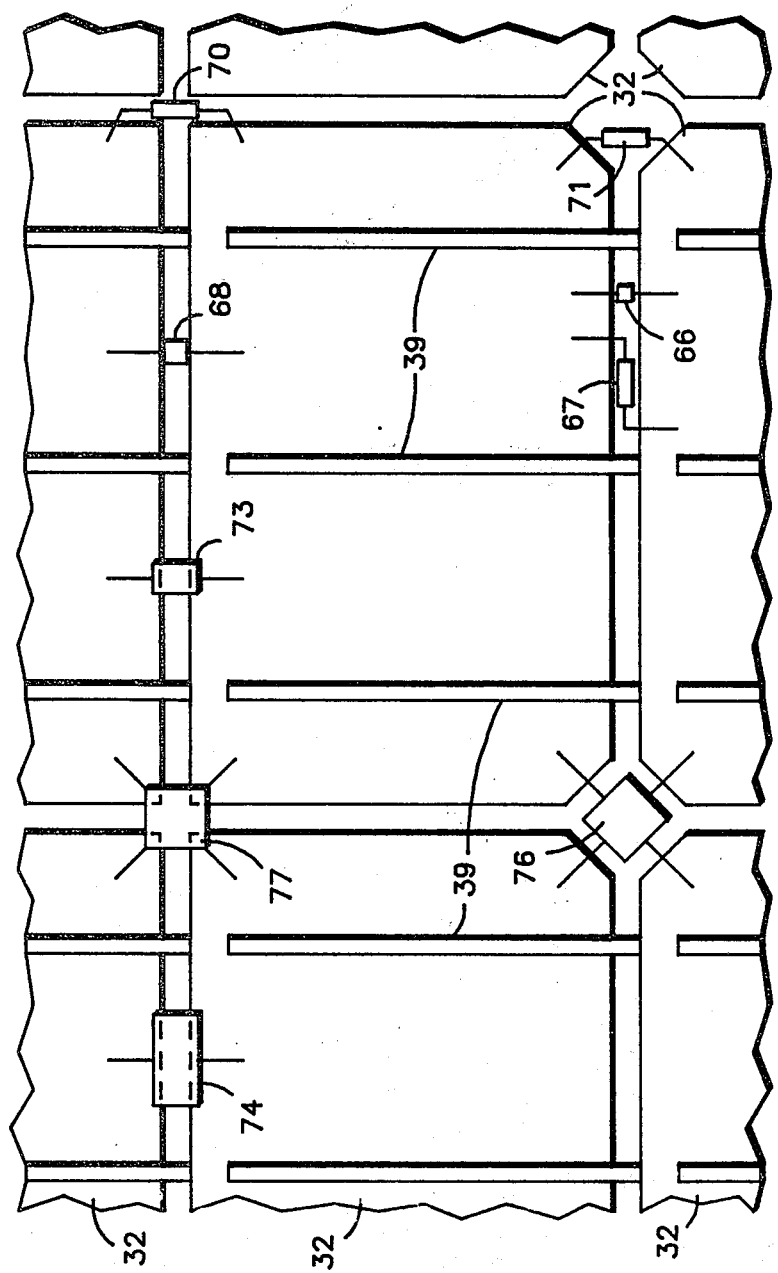

The protective diodes must be accommodated within the array of photovoltaic cells, preferably utilizing only a minimum of space within the module. FIG. 11 illustrates a variety of ways for positioning discrete protective diodes in parallel with the photovoltaic cells. In the portion of array illustrated a plurality of photovoltaic cells 32 are interconnected by a plurality of metal strips 39. The array is shown from the back, or non-illuminated side. Various geometries of protective diodes can be used. Packaged diodes 66, 67 of small physical size or unpackaged diodes 68 with, for example, ribbon leads are attached in the spaces between adjacent cells. Larger diodes 70, 71 are placed at cell corners or in the space left by clipped cell corners, respectively. Packages 73, 74, for example of molded plastic, can serve as spacers between cells as well as to contain diodes. Package count is reduced by packaging two diodes per package. The four-lead package 76, 77 is then attached at the cell corner or used as a corner spacer, respectively. The spacer diodes 73, 74, 77 are provided with indentations along appropriate edges to maintain the cell edges at the desired spacing.

Figure 12:
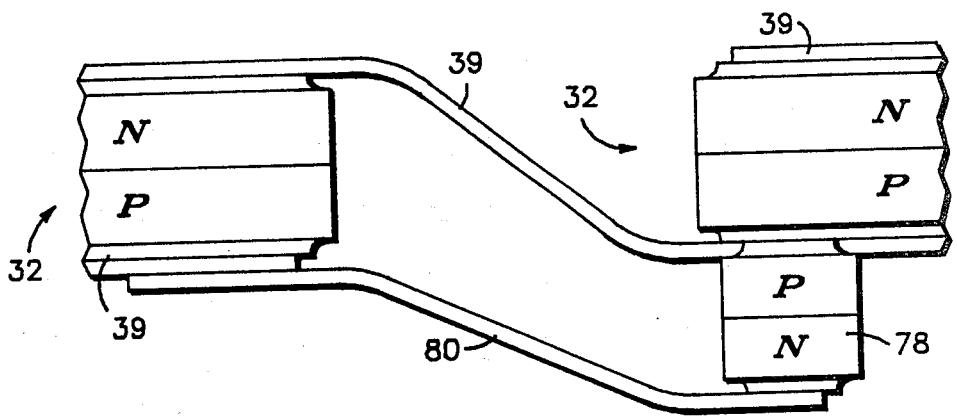

A further embodiment of the invention is illustrated in FIG. 12. In this embodiment, a plurality of cells 32 are interconnected by metal strips 39. A discrete protective diode 78 in chip form is attached to the rear surface of each photovoltaic cell. Protective diode 78 is connected in parallel to the photovoltaic junction by the bond to the bottom of the photovoltaic cell and the interconnection 80. Interconnecting the protective diodes in this manner results in a series of small bumps in the back plane of the array which are accommodated by corresponding depressions in the back skin of the laminated module.

Figure 13:
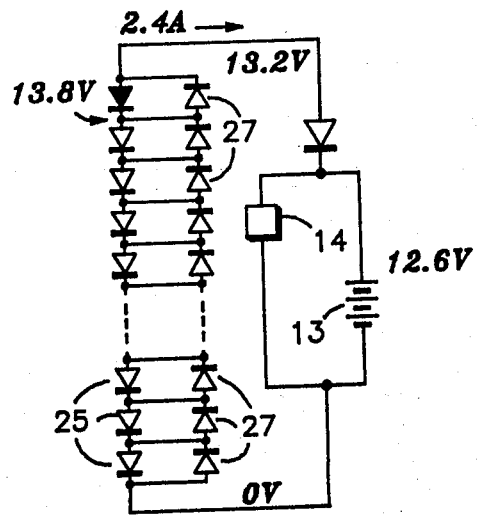
FIGS. 13 and 14 illustrate the effect of shadowing on a single cell of a module protected in accordance with the invention.
Figure 14:
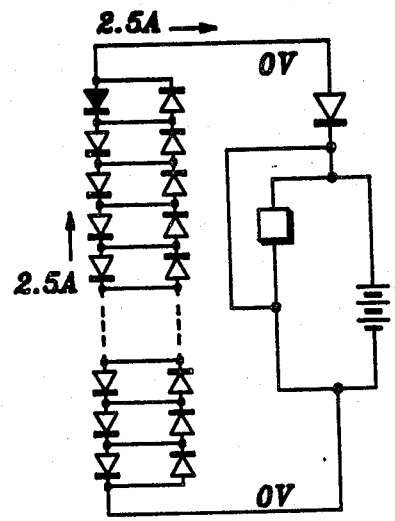
Figure 15:
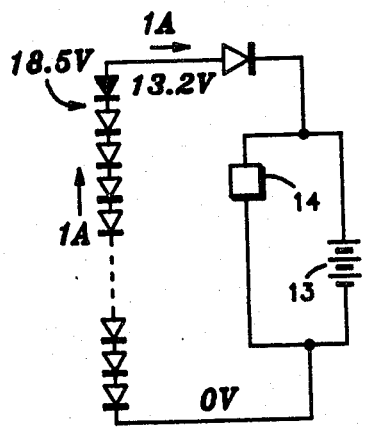
FIG. 15 illustrates the effect of shadowing on a single cell of an unprotected module.

Small systems, for example those utilizing a single battery, generally work in the 12-16 volt range with power levels of 10 watts to 1 kilowatt. FIG. 5 illustrates such a 12 volt system with individual protective diodes across each cell of the system under typical operating conditions. FIG. 13 illustrates the effect on that module if one cell in the array is shadowed. The system continues to operate under slightly reduced current, 2.4 Amp. rather than 2.5 Amp., and the shadowed cell has a reverse bias of about 0.6 volts impressed across it. Even in the short circuit condition illustrated in FIG. 14 which is generally considered to be the worst case condition, the shadowed cell is still only reverse biased by about 0.6 volts and dissipates less than 1.5 watts. This is in contrast to the unprotected module illustrated in FIG. 15 in which one shadowed cell draws about 1 amp and dissipates over 5 watts.

Thus, it is apparent that there has been provided, in accordance with the invention, an improved protection for photovoltaic modules which meets all the objects and advantages set forth above. While the invention has been described with a respect to certain embodiments thereof it is not intended that the invention be so limited. Particular arrangements of photovoltaic cells, placements of protective diodes, types of protective diodes, and module array sizes have been shown by way of illustration. It will be apparent to those skilled in the art after review of the foregoing description that further modifications and variations are possible. Accordingly, it is intended to embrace all such variations and modifications as fall within the scope of the appended claims.

I claim:

1. An improved photovoltaic module comprising a plurality of photovoltaic cells connected in series, each of said cells having a first side adapted for illumination and having a pattern of metallization thereon and a second side substantially covered by unpatterned metallization, and a plurality of protective diodes, one of said protective diodes coupled in parallel with and poled oppositely to each of said cells, wherein the improvement comprises: said protective diodes comprising discrete diodes attached between said second sides of adjacent photovoltaic cells, and wherein said protective diodes are positioned in spaces between adjacent ones of said plurality of photovoltaic cells.

2. An improved photovoltaic module comprising a plurality of photovoltaic cells connected in series, each of said cells having a first side adapted for illumination and having a pattern of metallization thereon and a second side substantially covered by unpatterned metallization, and a plurality of protective diodes, one of said protective diodes coupled in parallel with and poled oppositely to each of said cells, wherein the improvement comprises: said protective diodes comprising discrete diodes attached between said second sides of adjacent photovoltaic cells, and wherein said plurality of photovoltaic cells are positioned in an array having a space between adjacent ones of said plurality of cells and wherein said plurality of protective diodes are positioned in said space.

3. The module of claim 2 wherein said plurality of protective diodes function as spacers between said plurality of photovoltaic cells.

* * * * *